US006481809B1

(12) United States Patent
Richardson

(10) Patent No.: US 6,481,809 B1
(45) Date of Patent: Nov. 19, 2002

(54) SLIDING MODULE FOR COMPUTER COMPONENTS

(75) Inventor: Brian Edward Richardson, Fremont, CA (US)

(73) Assignee: Acorn Product Development, Inc., Fremont, CA (US)

( * ) Notice: Subject to any disclaimer, the term of this patent is extended or adjusted under 35 U.S.C. 154(b) by 60 days.

(21) Appl. No.: 09/661,007

(22) Filed: Sep. 13, 2000

(51) Int. Cl.[7] .............................................. A47B 81/00
(52) U.S. Cl. ................................... 312/223.2; 312/333
(58) Field of Search ......................... 312/223.1, 223.2, 312/223.3, 223.6, 333; 361/324, 325, 326, 327

(56) References Cited

U.S. PATENT DOCUMENTS

| | | | | | |
|---|---|---|---|---|---|
| 5,309,317 | A | * | 5/1994 | Ishikawa ................. 361/726 X |
| 5,460,441 | A | * | 10/1995 | Hastings et al. ..... 312/223.2 X |
| 5,726,866 | A | * | 3/1998 | Allen ..................... 361/727 X |
| 5,768,097 | A | * | 6/1998 | Jelinger ................ 361/726 X |
| 5,877,938 | A | * | 3/1999 | Hobbs et al. ........ 312/223.2 X |
| 5,949,645 | A | * | 9/1999 | Aziz et al. ........... 312/223.2 X |
| 6,038,126 | A | * | 3/2000 | Weng .................. 312/223.2 X |
| 6,137,684 | A | * | 10/2000 | Ayd et al. .................... 361/727 |
| 6,181,552 | B1 | * | 1/2001 | Neville, Jr. et al. ..... 361/724 X |
| 6,183,053 | B1 | * | 2/2001 | Foslien et al. ....... 312/223.2 X |
| 6,193,339 | B1 | * | 2/2001 | Behl et al. ............... 312/223.2 |
| 6,246,576 | B1 | * | 6/2001 | Sands et al. ........... 361/726 X |

* cited by examiner

Primary Examiner—Peter M. Cuomo
Assistant Examiner—Hanh V. Tran
(74) Attorney, Agent, or Firm—The Kline Law Firm

(57) ABSTRACT

A sliding module for computer components that is most often utilized for internet servers and the like. The module includes an outer housing that provides excellent R/F shielding for the components. A sliding mechanism is mounted on interior sides of the housing, so that the components can be completely enclosed. A sliding drawer is provided to mount the components. The component drawer includes a top panel that covers the open top front portion of the housing to complete the R/F shielding of the device. A rear side of the top panel includes a locking element that meshes with a locking element on a front side of the opening of the housing. The locking elements ensure that the top panel is in the proper position when the module is closed. The component mount also includes detachable securing mechanisms to lock the mount in place within the housing.

21 Claims, 8 Drawing Sheets

SLIDING MODULE FOR COMPUTER COMPONENTS

FIELD OF THE INVENTION

The present invention relates generally to computer component mounting devices, and more particularly is a sliding drawer type component module for a rack mounted computer system.

BACKGROUND OF THE INVENTION

As a company's computer system needs grow, the utilization of floor space becomes an increasingly important concern. Some or all of the system's components may be mounted in rack structures that allow a plurality of component modules to be stacked vertically. While this arrangement clearly reduces the demand for floor space, access to the components housed in the modules becomes significantly more difficult.

One method of addressing the access issue is to simply mount the components on a drawer-type slide. One example of a standard current art sliding device is the "Rack-Mounted Computer Apparatus" of Hastings et al., U.S. Pat. No. 5,460,441, issued Oct. 24, 1995. A slide is fixed to the component, and the assembly is then bolted into the rack structure. A similar device is the "Server Drawer Slide Mount Apparatus for a Rack-Mounted Computer System" of Good et al., U.S. Pat. No. 5,571,256, issued Nov. 5, 1996.

One of the chief difficulties in utilizing sliding device in combination with rack-mounted component housing is the great difficulty of getting the sliding devices aligned so that the components properly mounted in the racks. This issue is documented in some length in the prior art. It is clear that it is a difficult task to mount the slides so that the components are located at the proper depth and rest completely level within the rack.

In addition to being stacked one on top of another, the component modules should be completely enclosed to provide adequate RF shielding for the components. Since component drawers containing cards and connecting cables can be very shallow, access for maintenance, repair, and replacement is often gained through a top panel of the module. This requires that the top panel either be completely removable or hinged. If the panel is removable, access requires the removal of multiple screws or other fasteners, and then setting the top cover aside. This is time consuming, and the fasteners are quite easily lost. If the panel is hinged, the top cover must be opened upward. While the hinged arrangement provides a generally satisfactory means of access for the technician, hinged top covers inadvertently closing on a technician's fingers is a most undesirable, yet all too frequent, occurrence.

The prior art includes many references that address the need to vertically stack components for space considerations.

Accordingly, it is an object of the present invention to provide a sliding drawer-type module to house computer components, particularly 1U (1¾" high) modules. Other sizes of modules could of course utilize the principles disclosed herein.

It is a further object of the present invention to enclose the module to provide RF shielding for the components contained in the module.

It is a still further object of the present invention to provide a top cover access means that locks itself in position when the module is closed.

SUMMARY OF THE INVENTION

The present invention is a sliding module for computer components. It is most often utilized for internet servers and the like. The module includes an outer housing that provides excellent R/F shielding for the components. A sliding mechanism is mounted on interior sides of the housing, so that the components can be completely enclosed. A top front portion of the housing is open to provide access to printed circuit boards (PCB's) and cables.

A sliding component mount means is provided to mount the components. The component mount includes a top panel that covers the open top front portion of the housing to complete the R/F shielding of the device. A rear side of the top panel includes a locking element that meshes with a locking element on a front side of the opening of the housing. The locking elements ensure that the top panel is in the proper position when the module is closed. The component mount also includes detachable securing mechanisms to lock the mount in place within the housing.

An advantage of the present invention is that its unique construction allows the installation of four drive units side-by-side as opposed to the prior art capacity of three units side-by-side.

Another advantage of the present invention is that it provides a means to quickly and easily add components to a server system.

Yet another advantage of the present invention is that it enables ready access to components for repair or replacement.

A still further advantage of the present invention is that it provides excellent R/F shielding for the components that it contains.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
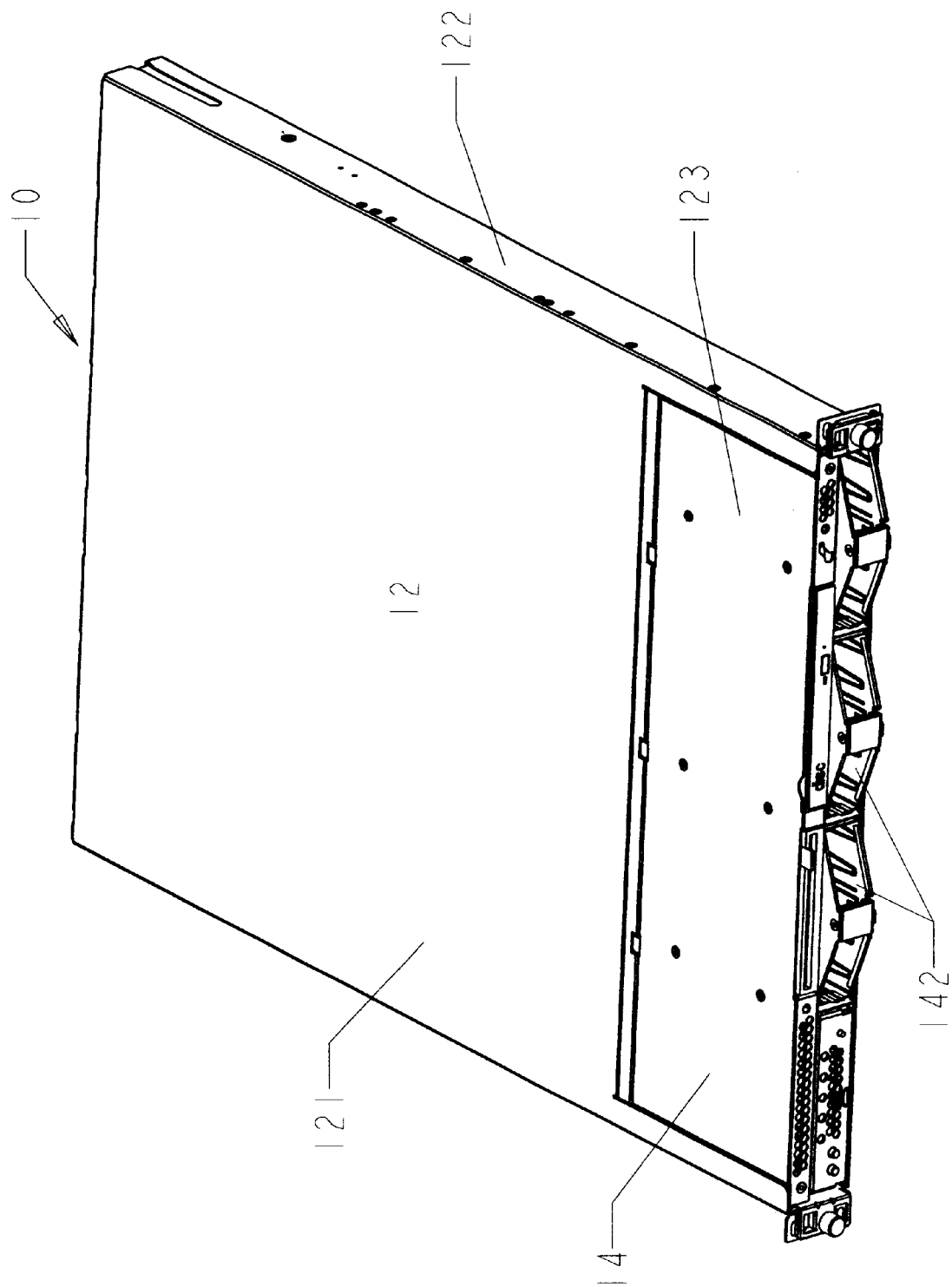
FIG. 1 is a perspective view of the sliding module of the present invention.
Figure 2:
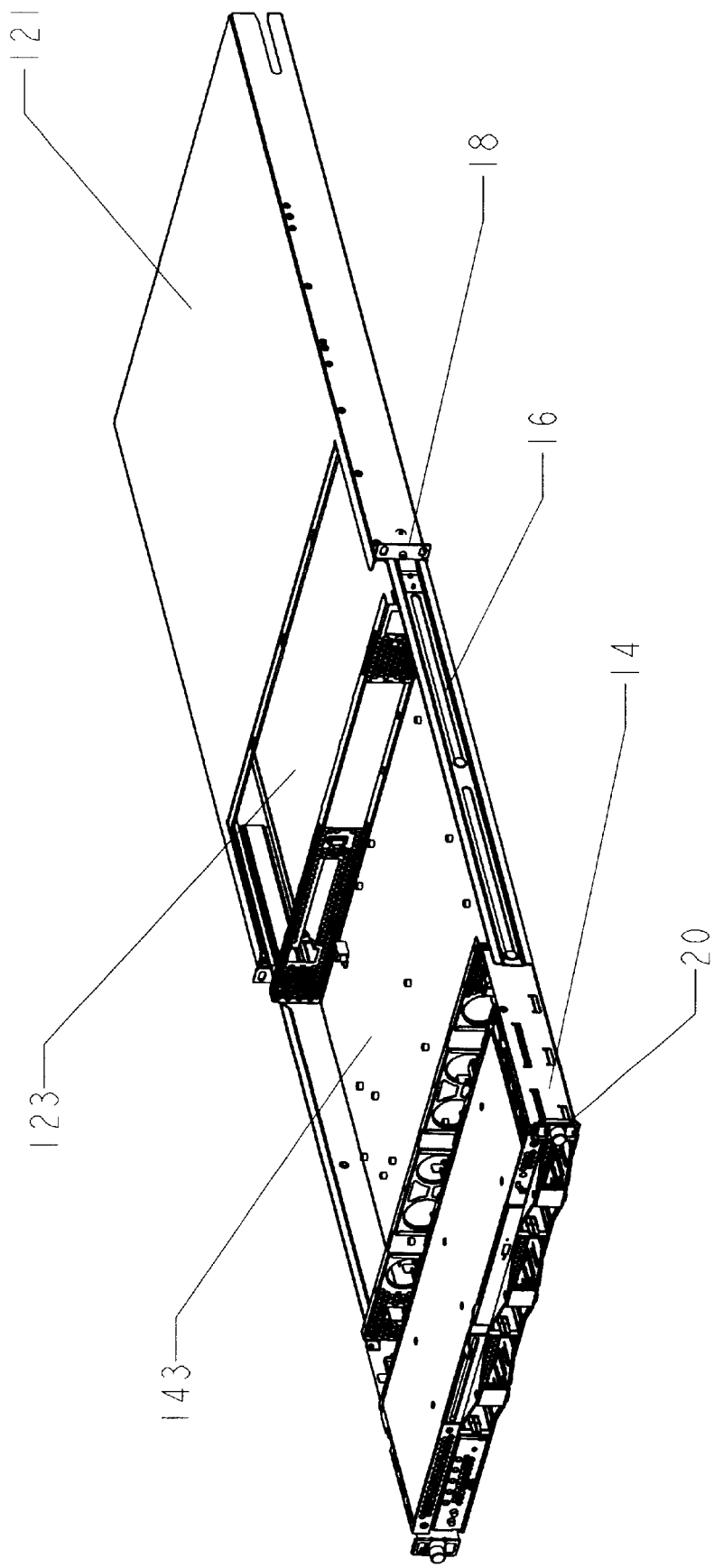
FIG. 2 a perspective view of the sliding module with the component drawer in an open position.
Figure 3:
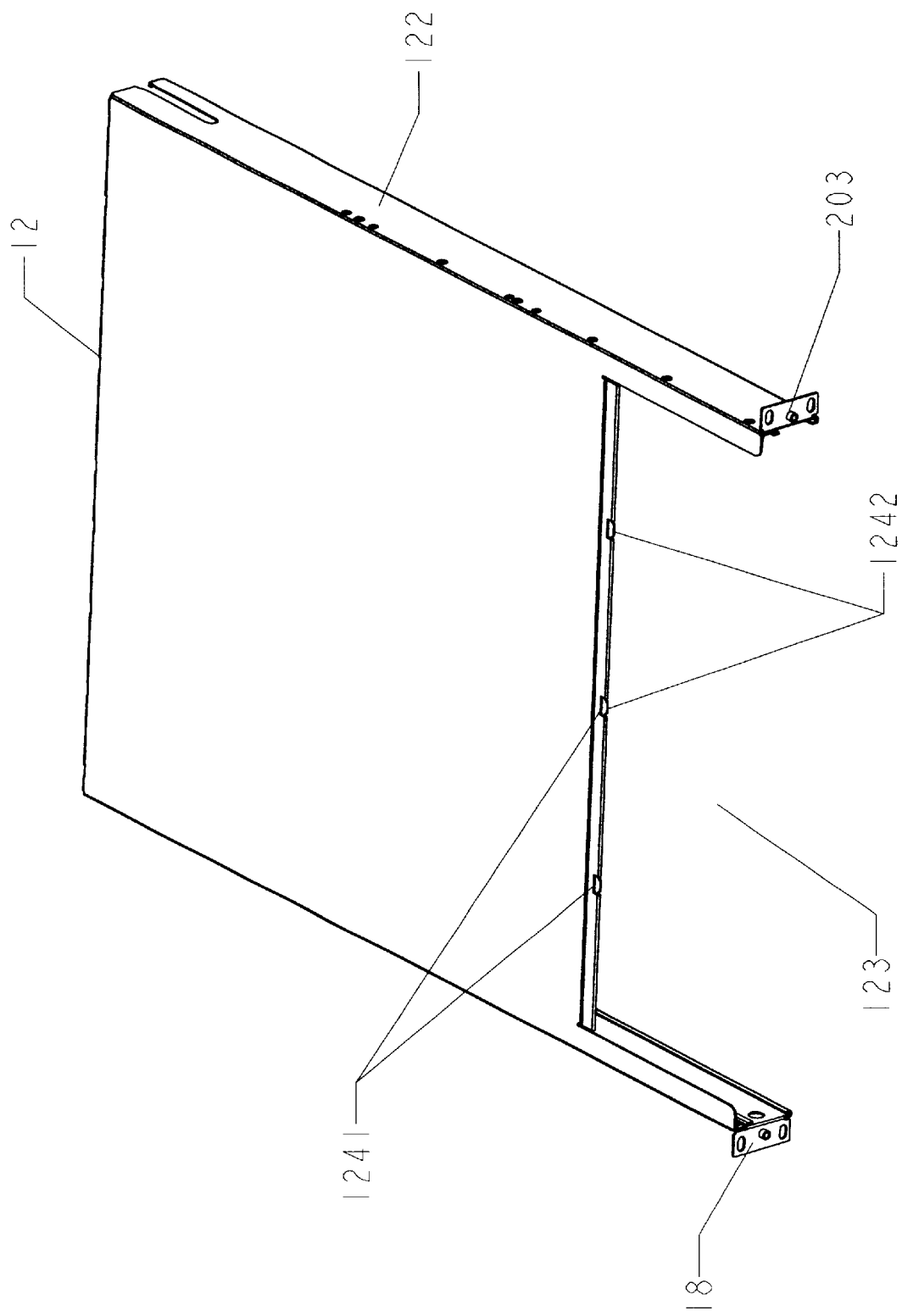
FIG. 3 is a perspective view of the housing.
Figure 4:
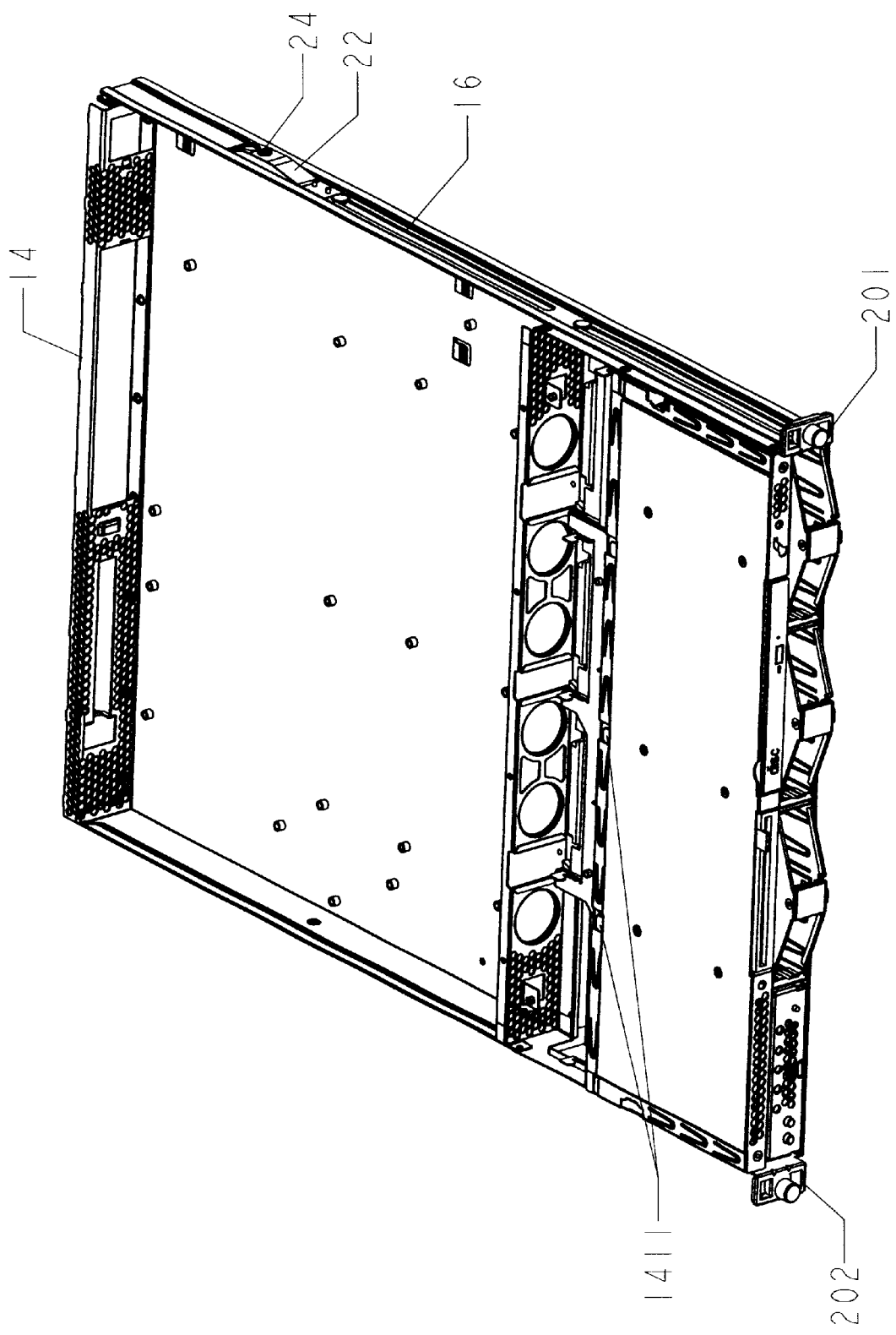
FIG. 4 is a perspective view of the component drawer.
Figure 5:
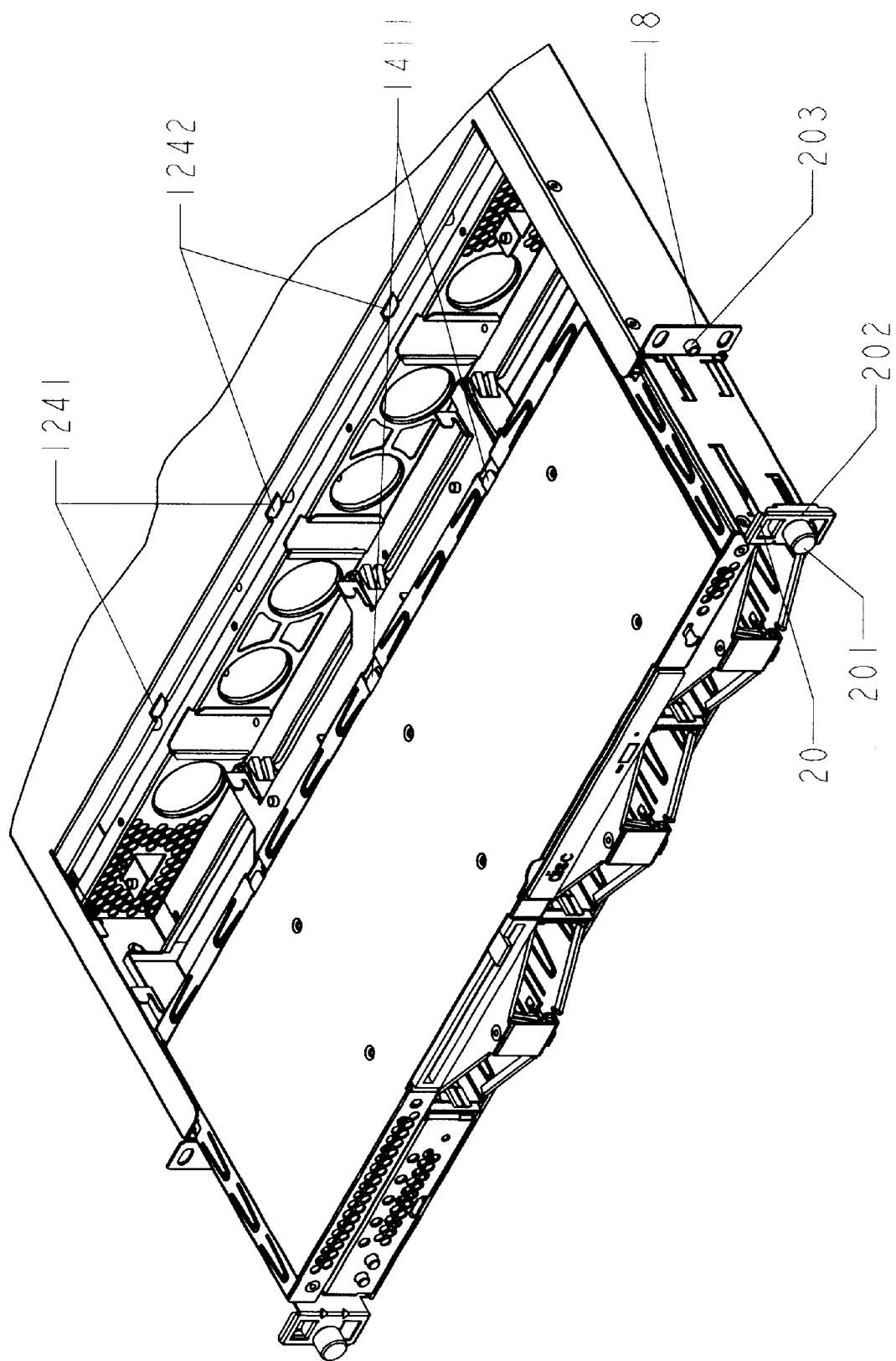
FIG. 5 is a detail view of the housing/component drawer junction.

The present invention is a sliding module 10 for computer components, and is most often utilized for internet server networks. The module 10 includes an upper housing 12 that covers a sliding component drawer 14. A slide mechanism 16 is provided at sides of the module 10 to enable the component drawer 14 to be easily moved into and extended from the housing 12. Mounting means 18 allow the module 10 to be secured in a server rack.

The housing 12 includes at least a top cover 121 and side covers 122. A front portion 123 of the top cover 121 is open to provide easy access to the assorted PCB's and cables contained in the module 10. A front edge of the top cover 121 at the rear of the open portion 123 includes a first locking element 124. In the preferred embodiment of the present invention, the first locking element 124 includes a plurality of recessed slots 1241 that each contain a downward curved tab 1242.

The first locking element 124 meshes with a second locking element 141 on an upper surface of the component mounting drawer 14. In the preferred embodiment, the second locking element 141 includes a plurality of protruding tabs 1411 that are received in the recessed slots 1241 of the first locking element 124 of the housing 12. The downward curved tabs 1242 of the first locking element 124 serve as guide mechanisms for the protruding tabs 1411 of the second locking element 141.

The component mounting drawer 14 further comprises a plurality of individual component compartments 142. The individual component compartments 142 receive the various components that are to be mounted in the module 10. The individual compartments 142 are open to the rear to facilitate connections.

The component mounting drawer 14 also comprises a bottom cover 143. The bottom cover 143 extends for the length of the module 10, which will typically be some distance behind the rear walls of the component compartments 142.

A securing means 20 is used to secure the sliding module 10 in a closed position. In the preferred embodiment, the securing means 20 comprises a pair of finger-operable spring loaded screws 201 mounted in ears 202 that extend outward at both sides of the front face of the mounting drawer 14. The screws 201 are received in threaded receiving holes 203 in the mounting means 18. The screws 201 are spring loaded so that a user removing the module 10 from the rack in which it is mounted can readily determine when the screws 201 have been released from the receiving holes 203.

Figure 6:
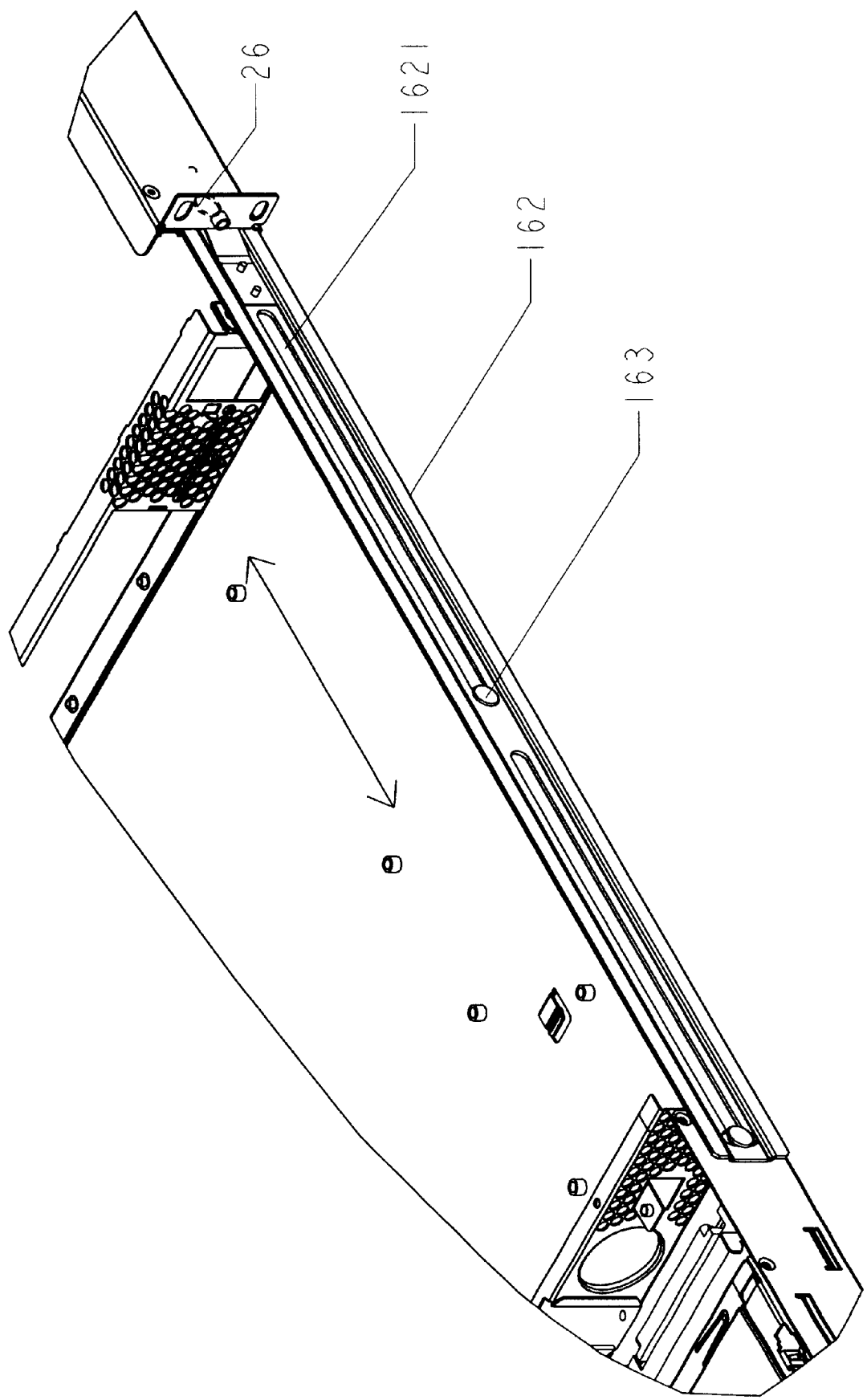
FIG. 6 is a side view showing the slide mechanism extended.
Figure 7:
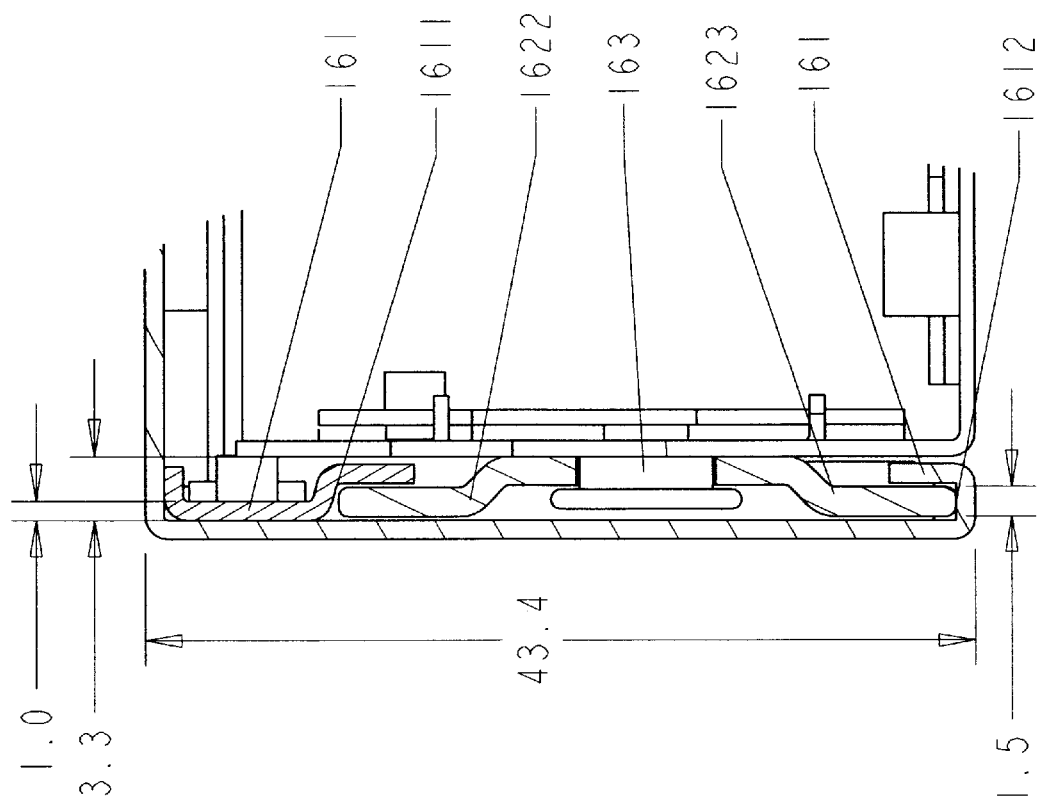
FIG. 7 is a cross section view of the slide mechanism.

With particular reference now to FIGS. 6 and 7, the slide mechanism 16 is constructed with a unique conformation to reduce the space required for the module. The slide mechanism 16 allows the required movement of the component drawer 14 relative to the housing 12. In the preferred embodiment, the slide mechanism 16 comprises generally a fixed slide track 161 mounted on the interior walls of each of the side covers 122 of the housing 12. The slide track 161 comprises an upper channel 1611 and a lower channel 1612.

A telescoping slide rail 162 is slidably mounted on each side of the component drawer 14. In the preferred embodiment, the slide rail 162 includes at least two travel slots 1621 that allow the rail 162 to slide on slide posts 163. An upper arm 1622 of the slide rail 162 is received in the upper channel 1611 of the slide track 161, and a lower arm 1623 of the slide rail 162 is received in the lower channel 1612.

Thus, when a user pulls the component drawer 14 out of the module 10, the slide posts 163 slide within the travel slots 1621, and the slide rail 162 also slides within the slide track 161. To ensure that the component drawer 14 is not pulled completely out of the module 10, stop means can be mounted on any or all of the component drawer, the slide rail, or the slide track. In the preferred embodiment, the stop means comprises a spring blade 22 with a protrusion 24. The protrusion 24 is received in an aperture 26 in the side covers 122 of the housing 12.

Figure 8:
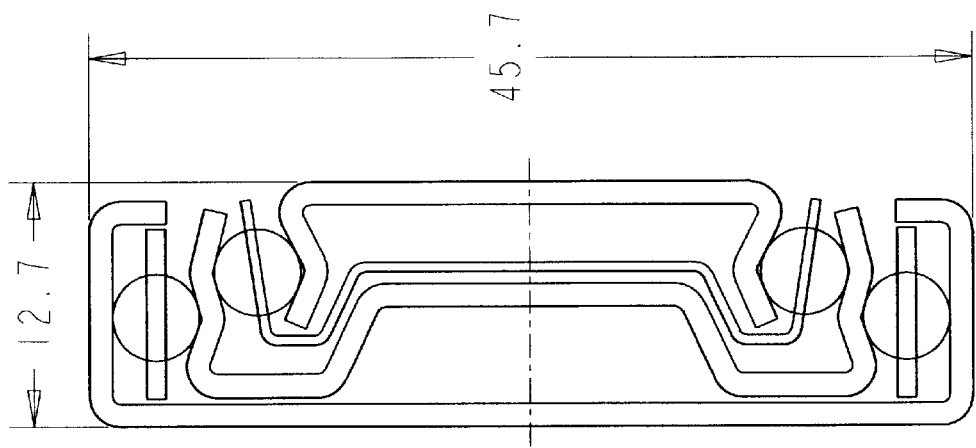
FIG. 8 is a cross section view of a prior art slide mechanism.

As is illustrated by comparing the structure of the slide mechanism 16 of the present invention with a prior art mechanism as illustrated in FIG. 8, the slide mechanism 16 takes advantage of the strength of its mounting components, so that fewer layers of material are necessary. The reduced number of layer in turn allows for a reduction of the thickness of the slide mechanism and side walls. It is this factor that allows the module 10 of the present invention to accommodate four drives side-by-side as opposed to the industry standard three drives side-by-side.

Operation of the sliding module 10 is therefore as follows: To extend the component drawer 14 outward from a closed position, the user first loosens screws 201 to release the securing means 20. This allows the user to pull the drawer 14 outward as far as he requires for his purposes.

When the user closes the drawer 14, he simply pushes the drawer 14 inward into the housing 12. As the drawer 14 closes, the protruding tabs 1411 of the drawer 14 mesh with the downward curved tabs 1242 of the housing 12. If the top cover of the component drawer 14 has sagged, the downward curved tabs 1242 serve as an alignment means for the protruding tabs 1411. The meshing of the protruding tabs 1411 with the downward curved tabs 1242 locks the top surface of the drawer in place. This ensures that when the component drawer 14 is closed, the top surface of the drawer 14 aligns with the top cover 121 of the housing 12 to form a planar surface. The top surface of the drawer, the top cover 121, the side covers 122, and the bottom cover 143 of the component drawer therefore form a module that is enclosed on the top, bottom, and sides with solid sheeting. The rear of the module is of course at least partially open to permit the necessary cable connections. The construction of the housing 12 and the drawer 14 provides the module 10 of the present invention with superior R/F shielding.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A sliding module adapted to contain electronic components comprising:

a housing, a component drawer, a slide mechanism, and mounting means adapted to secure said module in a server rack; wherein said housing includes a top cover and side covers, a front portion of said top cover is open to provide access to the components contained in said module, and a bottom side of said housing is also open, said component drawer comprises a bottom cover and a top panel, said bottom cover extends for a length of said module and said top panel having a size substantially equals to the open front portion of the top cover; wherein a top surface of said top panel of said component drawer, said top cover, said side covers, and said bottom cover of said component drawer form an enclosure that is R/F shielded on a top, a bottom, and sides thereof.

2. The sliding module of claim 1 wherein:

a front edge of said top cover at a rear side of said open portion includes a first locking element, and a rear edge of said top surface of said component drawer includes a second locking element; such that said first locking element meshes with said second locking element when said component drawer is in a closed position, thereby securing said top surface of said drawer in alignment with a top surface of said top cover so as to form a planar surface.

3. The sliding module of claim 2 wherein:

said first locking element comprises a plurality of recessed slots that each contain a downward curved tab, and said second locking element comprises a plurality of protruding tabs that are received in said recessed slots of said first locking element, said downward curved tabs of said first locking element serve as guide mechanisms for said protruding tabs of said second locking element during engagement of said locking elements.

4. The sliding module of claim 1 wherein:

said component drawer comprises a plurality of individual component compartments, said individual component compartments are open at a rear side thereof.

5. The sliding module of claim 1 wherein:

said sliding module further comprises a securing means that secures said sliding module in a closed position, said securing means comprises a pair of spring loaded screws mounted in ears that extend outward at both sides of a front face of said component drawer, said screws are received in threaded receiving holes in said mounting means.

6. The sliding module of claim 1 wherein:

said slide mechanism comprises a pair of track units, each one of said pair of track units is mounted between a respective one of said side covers of said housing and said component drawer, so that said slide mechanism is R/F shielded.

7. The sliding module of claim 6 wherein:

each said track unit comprises a fixed slide track mounted on an interior wall of said respective one of said side covers of said housing, said slide track comprises an upper channel and a lower channel, a telescoping slide rail is slidably mounted on each side of said component drawer, said slide rail includes at least two travel slots that allow said slide rail to slide on slide posts extending from said sides of said component drawer, an upper arm of said slide rail is received in said upper channel of said slide track, and a lower arm of said slide rail is received in said lower channel of said slide track; such that said component drawer extends fully from said housing, and said track units utilize only three layers of material, thereby reducing the space required for said track units in said module.

8. A sliding module adapted to contain electronic components comprising:

a housing, a component drawer, a slide mechanism, and mounting means adapted to secure said module in a server rack; wherein said housing includes a top cover and side covers, a front portion of said top cover is open to provide access to the components contained in said module, and a rear side of said housing is also open, said component drawer comprises a bottom cover and a top panel, said bottom cover extends for a length of said module and said top panel having a size substantially equals to the open front portion of the top cover; wherein a top surface of said top panel of said component drawer, said top cover, said side covers, and said bottom cover of said component drawer form an enclosure that is R/F shielded on a top, a bottom, and sides thereof.

9. The sliding module of claim 8 wherein:

a front edge of said top cover at a rear side of said open portion includes a first locking element, and a rear edge of said top surface of said component drawer includes a second locking element; such that said first locking element meshes with said second locking element when said component drawer is in a closed position, thereby securing said top surface of said drawer in alignment with a top surface of said top cover so as to form a planar surface.

10. The sliding module of claim 9 wherein:

said first locking element comprises a plurality of recessed slots that each contain a downward curved tab, and said second locking element comprises a plurality of protruding tabs that are received in said recessed slots of said first locking element, said downward curved tabs of said first locking element serve as guide mechanisms for said protruding tabs of said second locking element during engagement of said locking elements.

11. The sliding module of claim 8 wherein:

said component drawer comprises a plurality of individual component compartments, said individual component compartments are open at a rear side thereof.

12. The sliding module of claim 8 wherein:

said sliding module further comprises a securing means that secures said sliding module in a closed position, said securing means comprises a pair of spring loaded screws mounted in ears that extend outward at both sides of a front face of said component drawer, said screws are received in threaded receiving holes in said mounting means.

13. The sliding module of claim 8 wherein:

said slide mechanism comprises a pair of track units, each one of said pair of track units is mounted between a respective one of said side covers of said housing and said component drawer, so that said slide mechanism is R/F shielded.

14. The sliding module of claim 13 wherein:

each said track unit comprises a fixed slide track mounted on an interior wall of said respective one of said side covers of said housing, said slide track comprises an upper channel and a lower channel, a telescoping slide rail is slidably mounted on each side of said component drawer, said slide rail includes at least two travel slots that allow said slide rail to slide on slide posts extending from said sides of said component drawer, an upper arm of said slide rail is received in said upper channel of said slide track, and a lower arm of said slide rail is received in said lower channel of said slide track; such that said component drawer extends fully from said housing, and said track units utilize only three layers of material, thereby reducing the space required for said track units in said module.

15. A sliding module adapted to contain electronic components comprising:

a housing, a component drawer, a slide mechanism, and mounting means adapted to secure said module in a server rack; wherein
   said housing includes a top cover and side covers, a front portion of said top cover is open to provide access to the components contained in said module,
   said component drawer comprises a bottom cover and a top panel, said bottom cover extends for a length of said module and said top panel having a size substantially equals to the open front portion of the top cover; wherein
      a top surface of said top panel of said component drawer, said top cover, said side covers, and said bottom cover of said component drawer form an enclosure that is R/F shielded on a top, a bottom, and sides thereof; and wherein
   said slide mechanism comprises a pair of track units, each one of said pair of track units is mounted between a respective one of said side covers of said housing and said component drawer, so that said slide mechanism is R/F shielded, and
   each said track unit comprises a fixed slide track mounted on an interior wall of said respective one of said side covers of said housing, said slide track comprises an upper channel and a lower channel, and
   a telescoping slide rail is slidably mounted on each side of said component drawer, said slide rail includes at least two travel slots that allow said slide rail to slide on slide posts extending from said sides of said component drawer, an upper arm of said slide rail is received in said upper channel of said slide track, and a lower arm of said slide rail is received in said lower channel of said slide track; such that
   said component drawer extends fully from said housing, and said track units utilize only three layers of material, thereby reducing the space required for said track units in said module.

16. The sliding module of claim 15 wherein:
   a front edge of said top cover at a rear side of said open portion includes a first locking element, and
   a rear edge of said top surface of said component drawer includes a second locking element; such that
   said first locking element meshes with said second locking element when said component drawer is in a closed position, thereby securing said top surface of said drawer in alignment with a top surface of said top cover so as to form a planar surface.

17. The sliding module of claim 16 wherein:
   said first locking element comprises a plurality of recessed slots that each contain a downward curved tab, and
   said second locking element comprises a plurality of protruding tabs that are received in said recessed slots of said first locking element, said downward curved tabs of said first locking element serve as guide mechanisms for said protruding tabs of said second locking element during engagement of said locking elements.

18. The sliding module of claim 15 wherein:
   said component drawer comprises a plurality of individual component compartments, said individual component compartments are open at a rear side thereof.

19. The sliding module of claim 15 wherein:
   said sliding module further comprises a securing means that secures said sliding module in a closed position, said securing means comprises a pair of spring loaded screws mounted in ears that extend outward at both sides of a front face of said component drawer, said screws are received in threaded receiving holes in said mounting means.

20. A sliding module adapted to contain electronic components comprising:
   a housing,
   a component drawer,
   a slide mechanism, and
   mounting means adapted to secure said module in a server rack; wherein
      said housing includes a top cover and side covers, a front portion of said top cover is open to provide access to the components contained in said module,
      said component drawer comprises a bottom cover, said bottom cover extends for a length of said module; wherein
      a top surface of said component drawer, said top cover, said side covers, and said bottom cover form an enclosure that is R/F shielded on a top, a bottom, and sides thereof; and wherein
      a front edge of said top cover at a rear side of said open portion includes a first locking element, and
      a rear edge of said top surface of said component drawer includes a second locking element; such that
      said first locking element meshes with said second locking element when said component drawer is in a closed position, thereby securing said top surface of said drawer in alignment with a top surface of said top cover so as to form a planar surface.

21. The sliding module of claim 20, wherein:
   said first locking element comprises a plurality of recessed slots that each contain a downward curved tab, and
   said second locking element comprises a plurality of protruding tabs that are received in said recessed slots of said first locking element, said downward curved tabs of said first locking element serve as guide mechanisms for said protruding tabs of said second locking element during engagement of said locking elements.

\* \* \* \* \*